United States Patent
Okada

(10) Patent No.: US 7,636,267 B2
(45) Date of Patent: Dec. 22, 2009

(54) SEMICONDUCTOR MEMORY DEVICE

(75) Inventor: Kazuyuki Okada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 20 days.

(21) Appl. No.: 11/645,174

(22) Filed: Dec. 26, 2006

(65) Prior Publication Data
US 2007/0183232 A1 Aug. 9, 2007

(30) Foreign Application Priority Data
Dec. 27, 2005 (JP) .............................. 2005-376501

(51) Int. Cl.
*G11C 7/00* (2006.01)

(52) U.S. Cl. .................... 365/205; 365/230.06

(58) Field of Classification Search ................. 365/205, 365/230.06
See application file for complete search history.

(56) References Cited

U.S. PATENT DOCUMENTS 5,500,601 A * 3/1996 Lisart et al. ................. 324/713
5,684,748 A * 11/1997 Jang ............................ 365/201
5,748,545 A * 5/1998 Lee et al. .................... 365/201
6,781,902 B2 * 8/2004 Oumiya et al. .............. 365/201
6,795,372 B2 * 9/2004 Kim et al. ............... 365/230.06
6,982,920 B2 * 1/2006 Chevallier ............... 365/230.02
7,126,834 B1 * 10/2006 Meng et al. ............... 365/49.11
2004/0233706 A1* 11/2004 Burgan ........................ 365/154
2006/0262589 A1* 11/2006 Hirai et al. .................... 365/96
2007/0140039 A1* 6/2007 Iioka ..................... 365/230.06

FOREIGN PATENT DOCUMENTS

JP 2002-74995 3/2002

* cited by examiner

*Primary Examiner*—Michael T Tran
(74) *Attorney, Agent, or Firm*—McGinn IP Law Group, PLLC

(57) ABSTRACT

In a semiconductor memory device employing shared type sense amplifiers, entry is made to the test mode, and transfer gates, pre-charge circuits, and sense amplifiers used in the shared type sense amplifiers are controlled individually. An object bit line is placed in the high impedance state. The opposing sense amplifier is left active to place an adjacent bit line in the low impedance state. If there is a bit-line to bit-line short, data on the object bit line in the high impedance state is inverted from the adjacent bit line in the low impedance state. The bit-line to bit-line short can be detected by reading the inverted data.

18 Claims, 8 Drawing Sheets

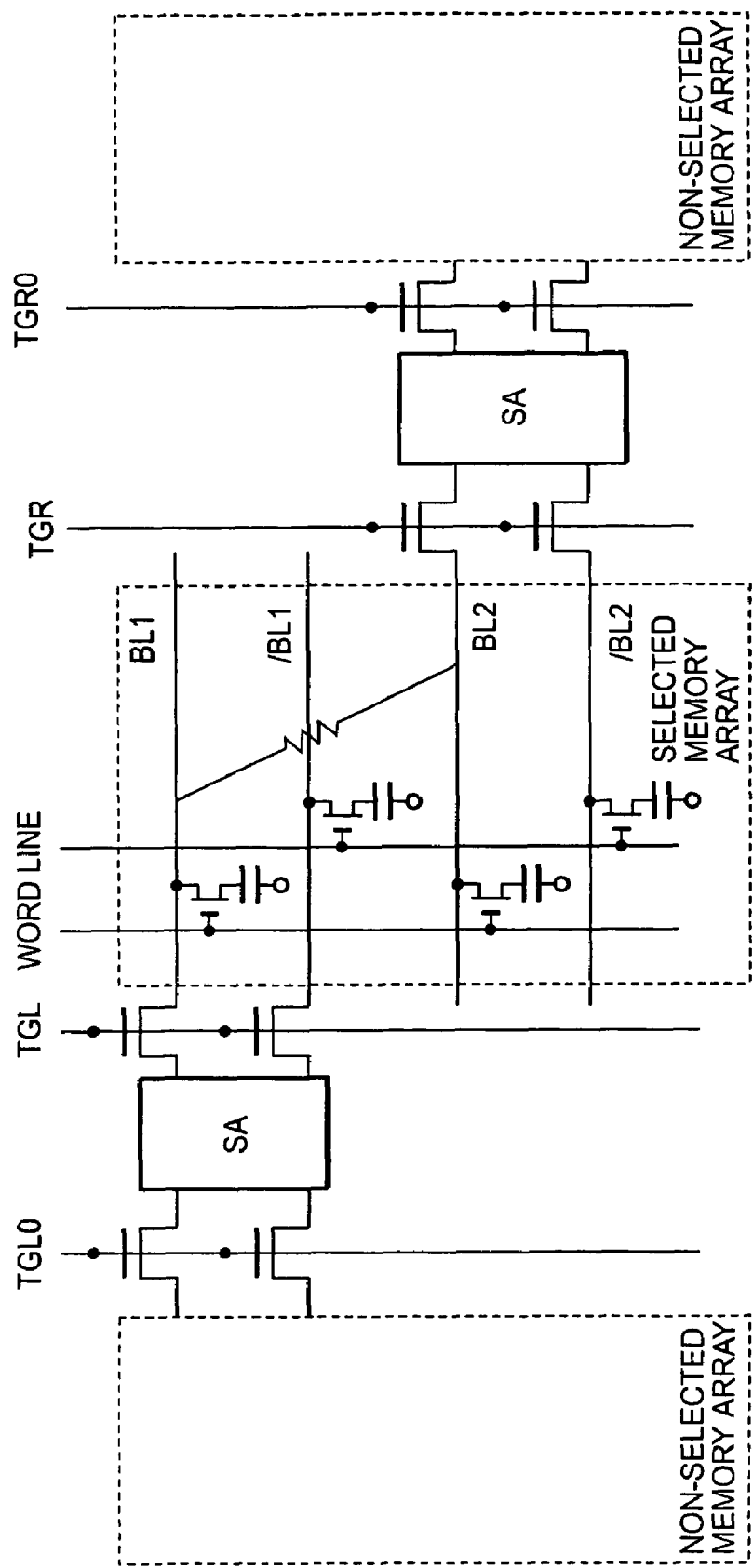

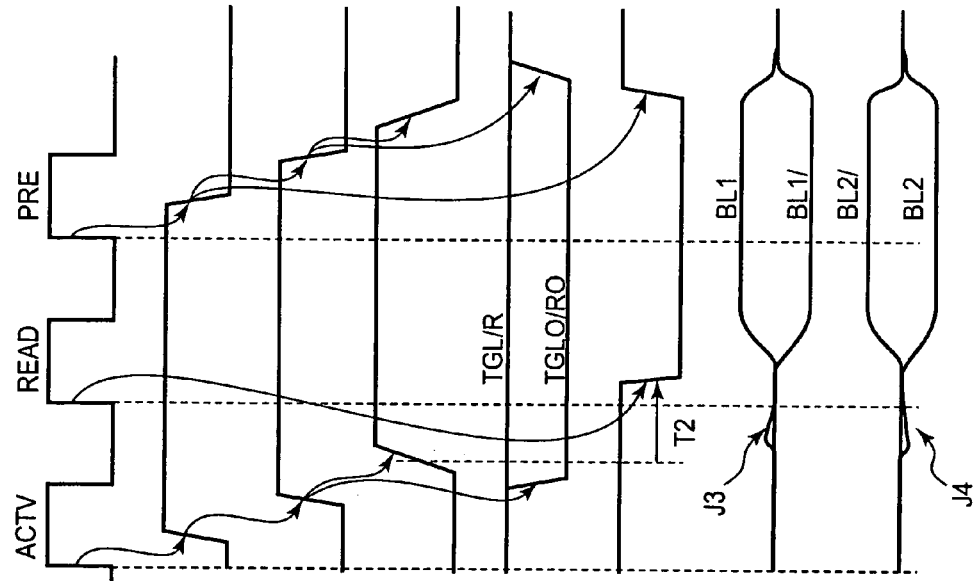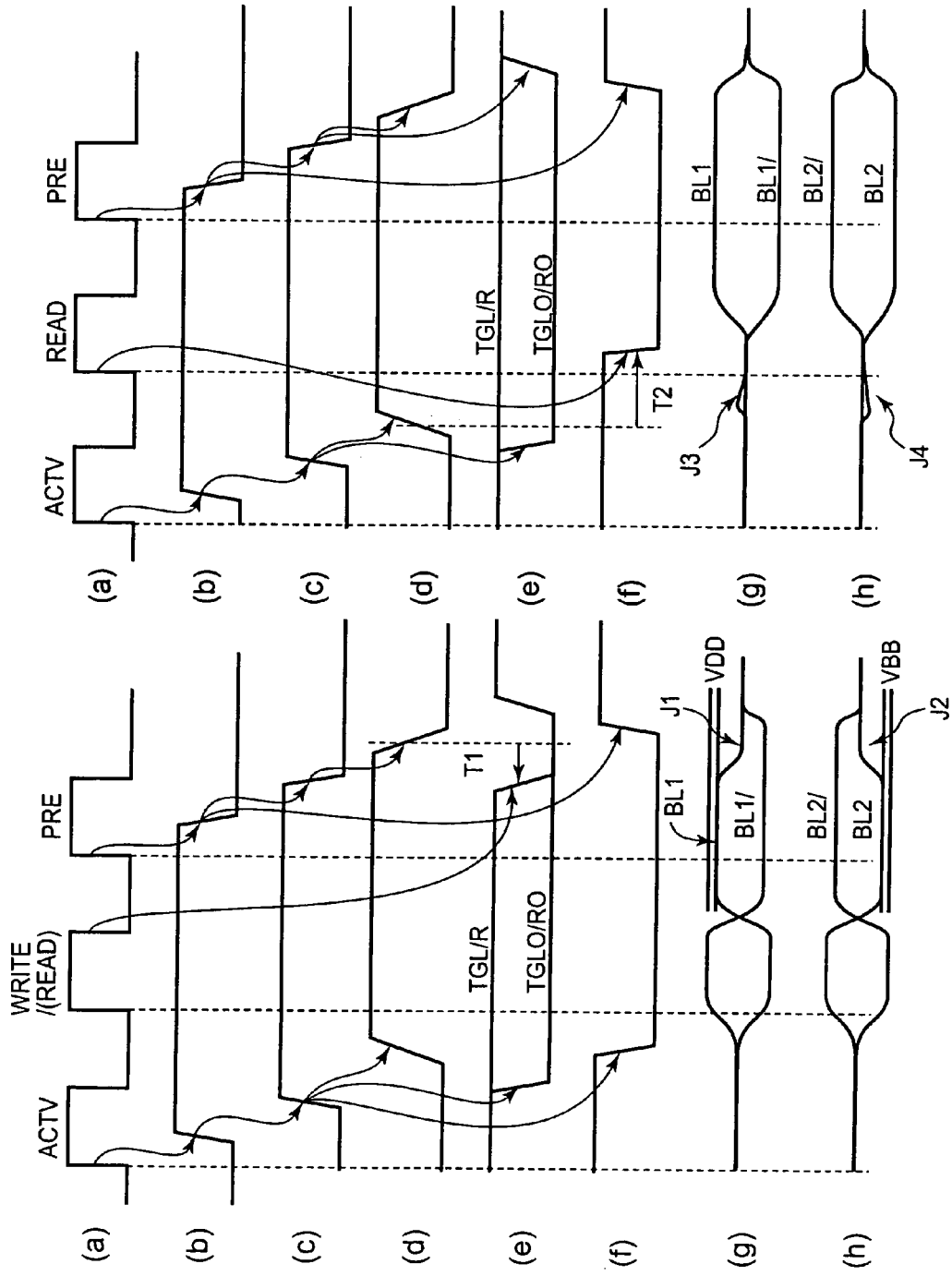

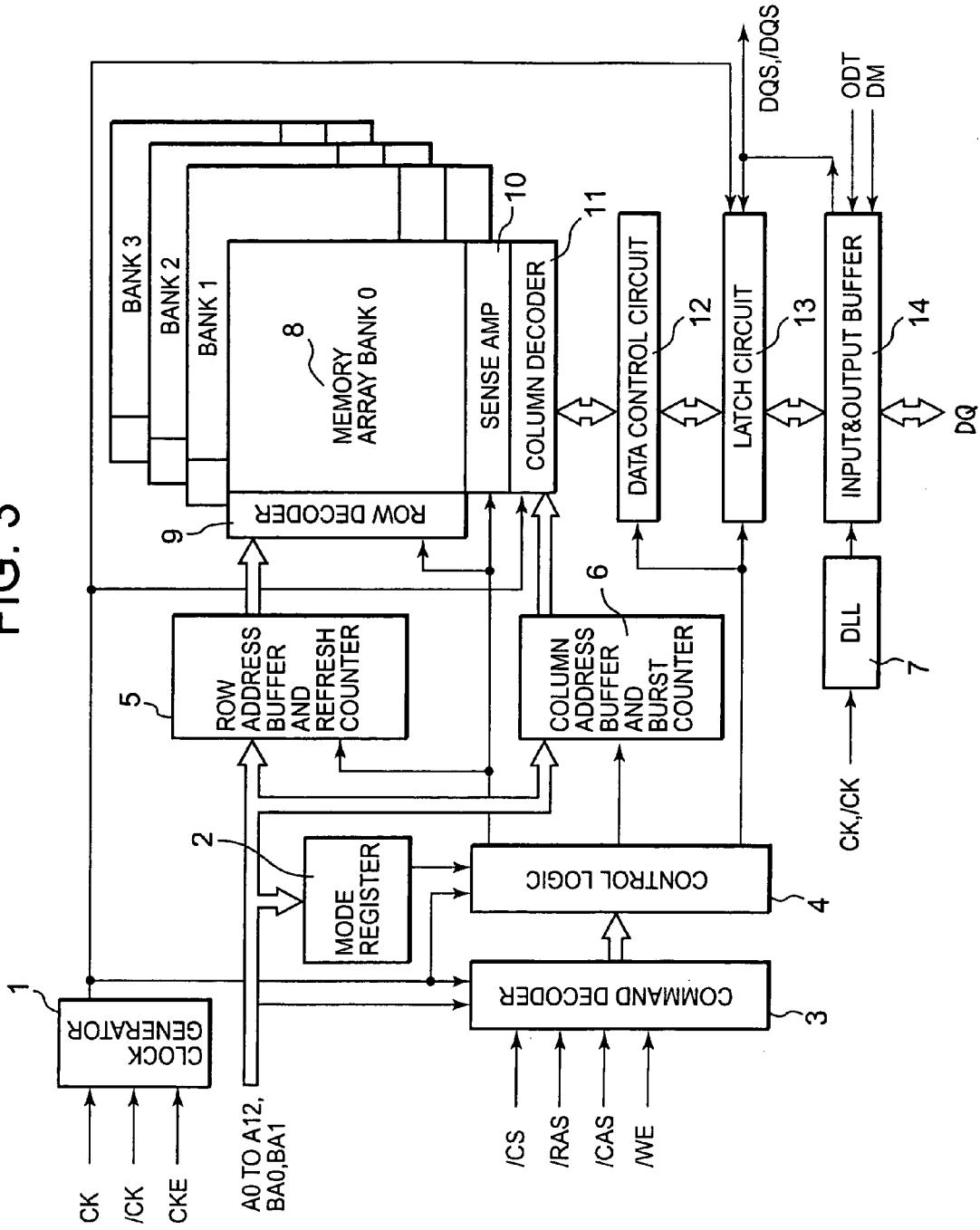

SEMICONDUCTOR MEMORY DEVICE

This application claims priority to prior Japanese patent application JP 2005-376501, the disclosure of which is incorporated herein by reference.

BACKGROUND OF THE INVENTION

1. Field of the Invention

The present invention relates to a semiconductor memory device, and in particular to a semiconductor memory device having a test mode for screening the semiconductor memory device.

2. Description of the Related Art

The semiconductor memory device has recently been making further progress in increase of the capacity and the operation speed of semiconductor devices. Along with such progress, the configuration within the semiconductor device has been more refined and the voltage has been decreased. These semiconductor memory devices are provided to customers after defective products are screened out by subjecting produced semiconductor wafers to wafer testing and subjecting packaged devices to a screening test. However, defects may occur which are difficult to find by the wafer test or screening test.

One of such defects difficult to find is a bit-line to bit-line short defect of memory cells. Even if there is a short between bit lines, it will be very difficult to detect if the resistance value of the short is high. Additionally, a long test time is required to detect the short. When such defective semiconductor memory device is incorporated in electronic equipment, there is a risk that the resistance value at a part having the bit-line to bit-line short will be decreased to cause increase of leak current while the electronic equipment is used by the customer. Therefore, it is urgently desired to develop a technique capable of detecting a high resistance short in a screening test.

Patent Publication 1 (Japanese Laid-Open Patent Publication No. 2002-074995) for example relates to the bit-line to bit-line short defects. A defect detection method disclosed in this patent publication will be briefly described with reference to FIGS. 1 and 2. FIG. 1 is connection diagram showing components relating to memory bit lines in a semiconductor memory device, and FIG. 2 is a timing chart thereof. The memory arrays shown in FIG. 1 employ shared type sense amplifiers, whose connection with the bit lines is controlled by transfer gates TG.

The shared type sense amplifiers exchange data with memory cells by switching and connecting bit lines of a selected memory array by means of the transfer gates TG. When a central memory array is selected, the transfer gates TGL and TGR are activated and connected to the sense amplifiers SA. If a left or right memory array is selected, a transfer gate TGL0 or TGR0 is activated and connected to the sense amplifier SA.

FIG. 2A shows a timing chart of a first embodiment of the prior art, while FIG. 2B shows a timing chart of a second embodiment of the prior art. FIGS. 2A and 2B illustrate signal waveforms of (a) a command, (b) a bank control signal, (c) a memory array selection signal, (d) a word line, (e) the transfer gates (f) the sense amplifier, (g) the first bit line, and (h) the second bit line. The description here will be made of a case where bit-line to bit-line short has occurred between the first and second bit lines (BL1 and BL2).

Referring to FIG. 2A, the detection of high resistance short is carried out as follows: The transfer gates TGR and TGL are turned OFF by the falling edge of a write (or read) command with the word line kept in the selected state. This state is kept for a predetermined time and then changed to the pre-charge state after the word line is placed in the non-selected state.

A description will be made of a principle why the operation described above enables the detection of high resistance short between the bit lines. The turning OFF of the transfer gates TGR and TGL cuts the connection of the sense amplifier from the bit lines, whereby the bit lines are rendered floating. In this state, the adjacent bit lines are made to have data of opposite logic values (by writing or reading).

When there is a relatively high-resistance short between the bit lines, for example, electric current flows from the memory cell bit line in which data of logic value "1" is written to the memory cell bit line in which data of logic value "0" is written. As shown by J1 and J2 in FIG. 2A, the voltages of these bit lines are canceled with each other. This causes the bit lines BL1 and BL2 to become an intermediate level that cannot be determined either as a high level or as a low level. When voltages of these bit lines at the intermediate level are stored in a memory cell, data corruption will occur in the memory cell. Accordingly, the data corruption due to the bit-line to bit-line short can be found when the data is read subsequently.

In the prior art second embodiment shown in FIG. 2B, when the word line is activated, minute potential differences J3 and J4 are generated in the bit line pairs due to the charge in the memory cells. Normally, the sense amplifiers SA should be activated at the time when the minute potential differences J3 and J4 are generated in the bit line pairs. However, in the test mode according to the prior art, the sense amplifiers SA are not activated. Therefore, the minute potential differences J3 and J4 disappear by being cancelled by the bit-line to bit-line short, and the potential of the bit lines becomes an intermediate potential. The sense amplifiers SA are activated after a delay of time T2 from the rising of the word line. Since the bit lines are at the intermediate potential, the memory cell data cannot be read correctly. This makes it possible to find the data corruption due to the bit-line to bit-line short.

Although the bit-line to bit-line short can be detected, as described above, the implementation of the prior art involves two major problems. One of the problems relates to the fact that, in short detection, the transfer gates TG or the sense amplifiers SA are turned off to render the bit lines floating, and the charges in the bit lines are charged or discharged, and canceled with each other by resistance shorting between the bit lines which are in the floating state. The charge/discharge time is determined based on a time constant $\tau$ that is determined by the value of the shorting resistance and the capacity of the bit lines. The resistance value is originally high, and hence the time constant $\tau$ becomes a large time constant. This means that it takes a long time to detect the bit-line to bit-line short. Moreover, the resistance value, including variations thereof, must be estimated preliminarily in the course of designing.

Another problem relates to the fact that it is uncertain whether the intermediate level of the memory cell is determined to be either high level or low level by the sense amplifier SA. The sense amplifier SA always determines unambiguously whether the level is high or low. In the case of the intermediate level, however, it is ambiguous whether the bit lines are determined to be either high level or low level depending on the offset of the sense amplifier SA and surrounding noises. This makes it difficult to obtain reliable defect detection results. In this manner, the difficulty to produce a difference in potential between adjacent bit lines induces a problem that the detection sensitivity is low. Thus, according to the prior art, it takes a long time to obtain a detection result, and the detection sensitivity is low due to the difficulty to produce a difference in potential between adjacent bit lines. In conclusion, the prior art is not free of the problem the difficulty in detection of the bit-line to bit-line short.

As described above, the conventional semiconductor memory devices have problems that the bit-line to bit-line short in a memory cell is difficult to detect due to its large resistance value, and a long test time is required.

SUMMARY OF THE INVENTION

In view of the problems described above, it is an object of the present invention to provide a semiconductor memory device having a test mode for detecting a bit-line to bit-line short with a reduced detection time and more reliable manners.

It is another object of the present invention to provide a method of identifying short in lines in arrays of memory cells of a semiconductor memory device with a reduced detection time and more reliable manners.

According to the present invention, there is provided a semiconductor memory device employing shared type sense amplifiers, the semiconductor memory device having a test mode for detecting a bit-line to bit-line short by placing in the high impedance state a first bit line connected to a first sense amplifier arranged on a first side of a selected memory array, while placing in the low impedance state a second bit line connected to a second sense amplifier arranged on a second side of the selected memory array opposing the first side.

The first and second bit lines are controlled programmable by means of addresses and commands which are input externally.

The first and second bit lines are arranged adjacent to each other, and a memory cell is written such that the first and second bit lines assume opposite logic levels.

In the state where cell data is amplified by the first and second sense amplifiers, a first transfer gate arranged between the first sense amplifier and the first bit line is turned OFF while a second transfer gate arranged between the second sense amplifier and the second bit line is turned ON, and the first bit line is inverted by the second sense amplifier if there is a short between the first and the second bit lines to enable detection of the bit-line to bit-line short.

Pre-charge operation and read operation are performed after detection of the bit-line to bit-line short.

In the alternative, during the pre-charge period after cell data is written from the first and second sense amplifiers, the first sense amplifier may be placed in the OFF state while the second sense amplifier in the ON state, the first bit line being in the pre-charge state, and the second bit line being made to undergo a full amplitude by the second sense amplifier.

After the termination of the pre-charge period, the first bit line is in the high impedance state while the second bit line is made to undergo a full amplitude by the second sense amplifier, and if there is a short between the first and second bit lines, the first bit line is inverted by the second sense amplifier to enable detection of the bit-line to bit-line short.

In another aspect of the invention, the present invention provides a semiconductor memory device comprising a first sense amplifier shared by a first memory array and a second memory array, a second sense amplifier shared by a first memory array and a third memory array, wherein:

the first semiconductor memory array comprises a first complementary bit line pair connected to the first sense amplifier via a first switch, a second complementary bit line pair connected to the second sense amplifier via a second switch, a bit line of the second complementary bit line pair being arranged adjacent to a bit line of the first complementary bit line pair, word lines for selecting memory cells, and control circuit for controlling the first switch and the second switch, and wherein:

a bit line to bit line short is detected by putting the first bit line pair into a high impedance state and the second bit line pair into a low impedance state in response to a test mode set command.

The high impedance state and the low impedance state may be made by setting the first switch non-conductive and the second switch conductive for a predetermined time.

Cell data is written into memory cells such that the first and second bit lines assume opposite logic levels.

Cell data is read from the memory cells to see if there is an inversion of a written logic level.

Moreover, the present invention provides a method of identifying short in lines in memory arrays of a semiconductor memory device comprising a first sense amplifier shared by a first memory array and a second memory array, a second sense amplifier shared by a first memory array and a third memory array, the first semiconductor memory array comprises a first complementary bit line pair connected to the first sense amplifier via a first switch, a second complementary bit line pair connected to the second sense amplifier via a second switch, a bit line of the second complementary bit line pair being arranged adjacent to a bit line of the first complementary bit line pair, the method comprising steps of:

writing cell data into memory cells so that the first and second bit lines assume opposite logic levels, putting the first bit line pair into a high impedance state and the second bit line pair into a low impedance state in response to a test mode set command, and reading cell data from the memory cells to see if there is an inversion of a written logic level.

According to the configuration of the present invention, an object bit line is placed in the high impedance state. The opposing sense amplifier is left active to place the adjacent bit line in the low impedance state. If there is a bit-line to bit-line short, data on the object bit line in the high impedance state is inverted from the adjacent bit line in the low impedance state. The bit-line to bit-line short can be detected by reading the inverted data.

Since these controls are performed by means of externally address inputs and commands, an advantageous effect is provided that the controls can be performed programmably. The programmable control makes it possible to control the defect detection time according to a type of products and thus to appropriately adjust the defect detection sensitivity according to each type of products. This means that the necessity of estimating variation in leak resistance is eliminated. Moreover, advantageous effects can be obtained that the circuit configuration is very simple, the detection speed is high, and the detection sensitivity is high.

BRIEF DESCRIPTION OF THE DRAWINGS

FIG. 1 is a diagram illustrating connections in the periphery of bit lines according to the prior art;

FIGS. 2A and 2B are timing charts of the components shown in FIG. 1;

FIG. 3 is a general configuration diagram of a DRAM;

DESCRIPTION OF THE PREFERRED EBODIMENTS

Preferred embodiments of the present invention will be described with reference to the accompanying drawings.

Figure 4:
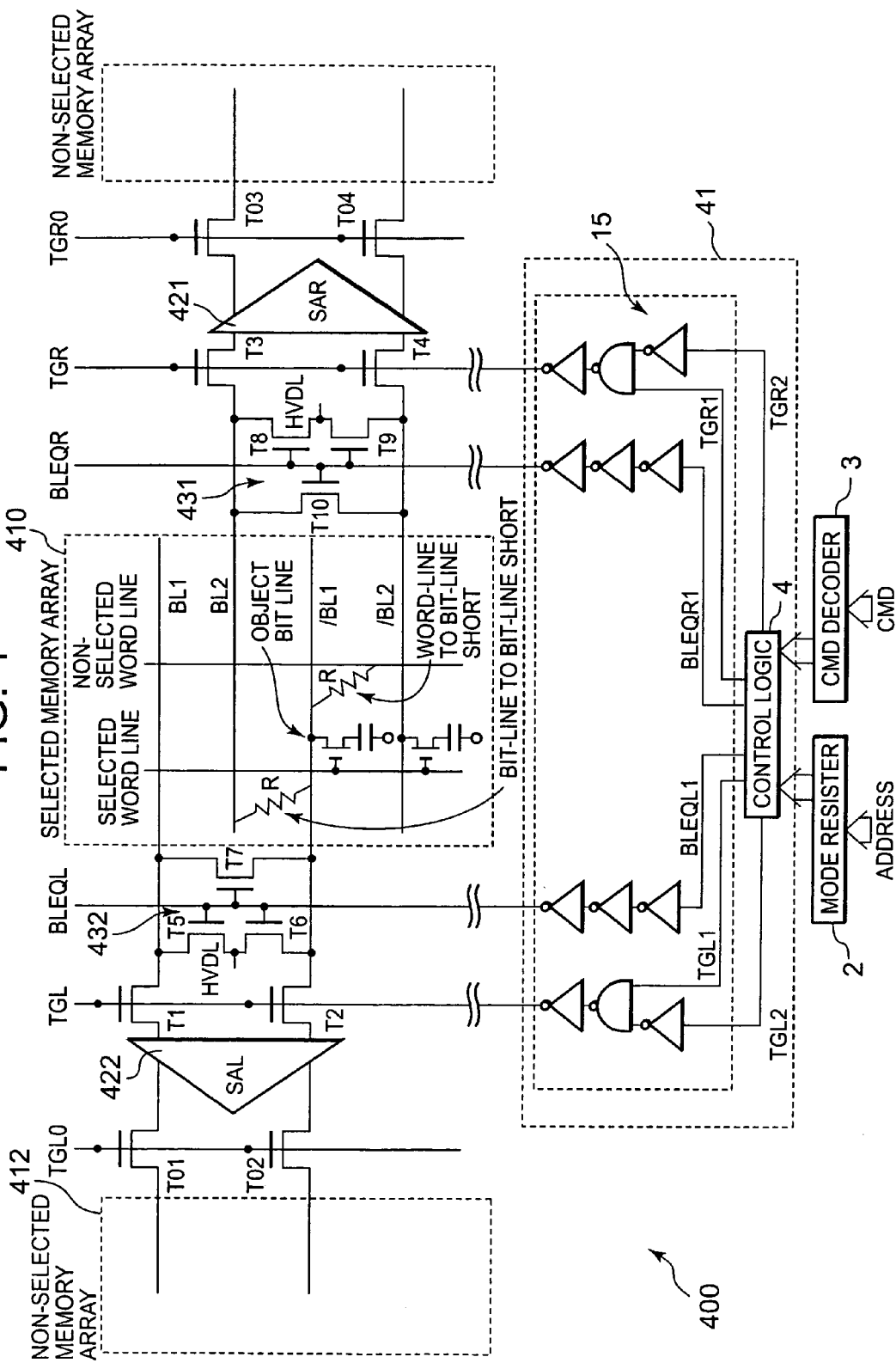
FIG. 4 is a diagram illustrating configuration in the periphery of memory arrays according to a first embodiment of the present invention.
Figure 5:
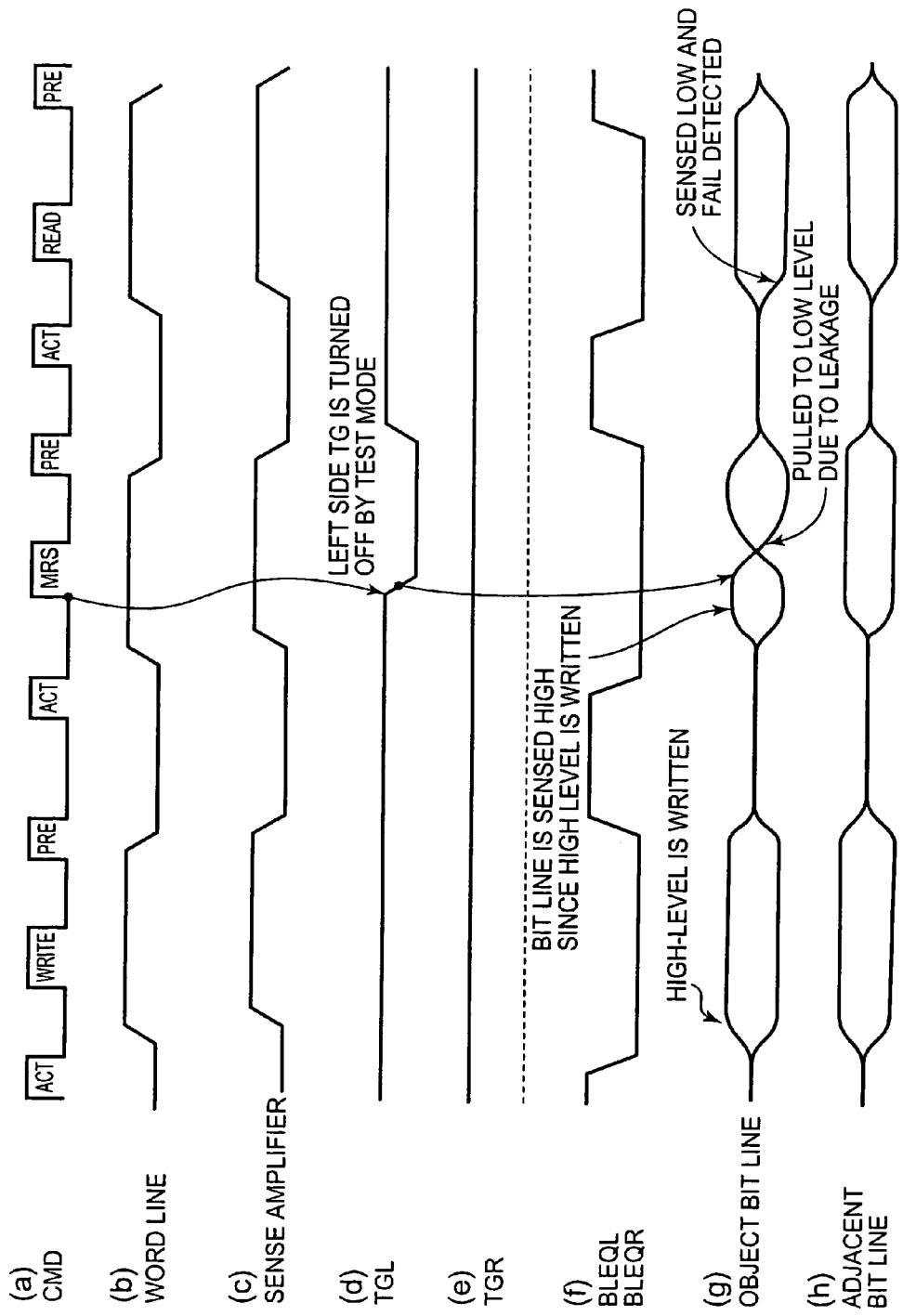
FIG. 5 is a timing chart illustrating operation in the test mode according to the first embodiment.
Figure 6:
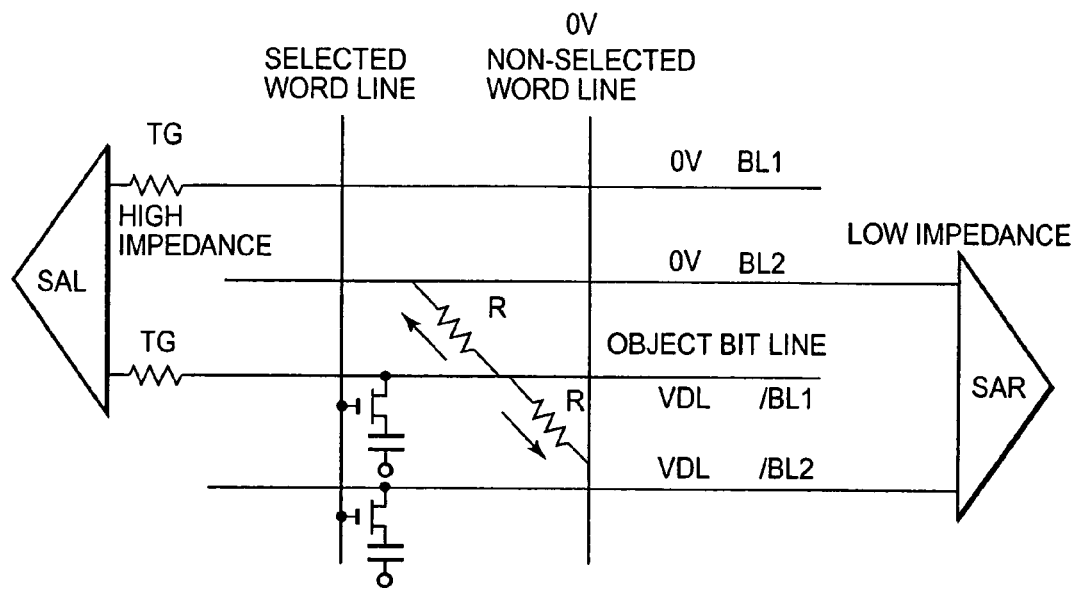
FIG. 6 is a diagram illustrating connections in the periphery of bit lines according to the first embodiment.
Figure 7:
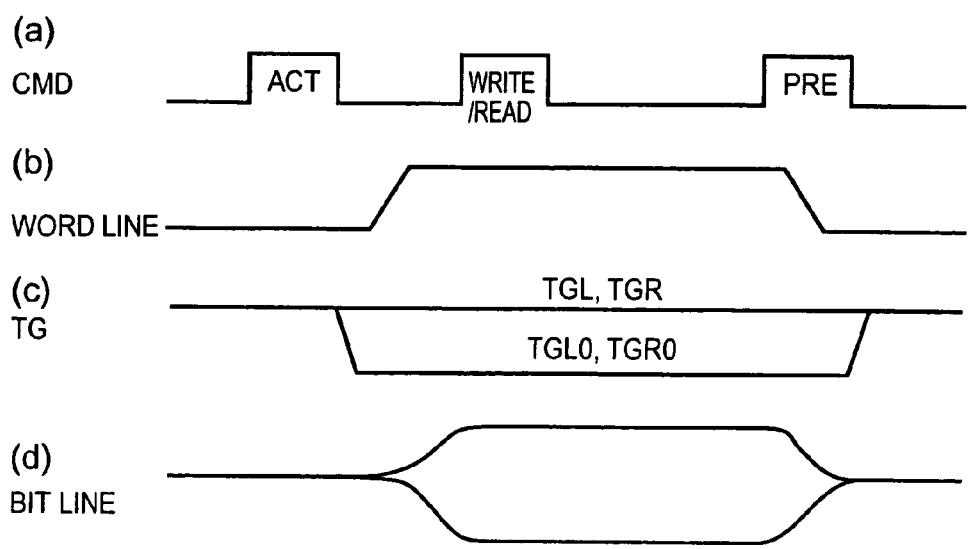
FIG. 7 is a timing chart illustrating operation in the normal mode of the circuit shown in FIG. 4.

A first embodiment will be described with reference to FIGS. 3 to 7. FIG. 3 is a general configuration diagram showing a dynamic random access memory (DRAM) as an example of a semiconductor memory device. FIG. 4 is a circuit diagram of the periphery of memory cells according to the first embodiment. FIG. 5 is a timing chart in the test mode. FIG. 6 is a diagram illustrating connections relating to bit lines. FIG. 7 is a timing chart in the normal mode.

Referring to FIG. 3, the DRAM includes a memory array 8 having a plurality of memory array banks built-in, a row decoder 9, a colurn decoder 11, a sense amplifier 10. The DRAM also includes a row address buffer and refresh counter 5, a column address buffer and burst counter 6, a data control circuit 12, a latch circuit 13, an input and output buffer 14, a mode register 2, a command decoder 3, a control logic circuit 4, a clock generator 1 and a delayed lock loop (DLL) 7. The DRAM externally receives clock signals CK and /CX, a clock enable signal CKE, address signals A0 to A12, bank address signals BA0 and BA1, a chip select signal /CS, a row address strobe signal /RAS, a column address strobe signal /CAS, a write enable signal /WE, a data signal DQ, data strobe signals DQS and /DQS, an on-die termination signal ODT, and a data mask signal DM.

The clock generator 1 generates an internal clock and supplies the clock to various internal circuits to synchronize the operation thereof. The command decoder 3 receives the chip select signal /CS, row enable /RAS, column enable /CAS and write enable /WE inputs. The command decoder 3 recognizes various commands depending on the inputs thereto. The command decoder outputs the command to the control logic 4 which controls the operation of the other components of the DRAM based on the received command. These commands includes, for example, a write command, a read command, a pre-charge command, an active command and a mode register set command. When the mode register set command is received, the control logic 6 causes the mode register 2 to latch the address data or address inputs: A0-A12 and BA0-BA1. During the mode register set operation, the data on address inputs A0-A12 and BA0-BA1 do not represent addresses. Hereinafter, the address inputs and the data thereon will generally be referred to as address inputs.

According to the Joint Electron Device Council (JEDEC) standard, the mode register 2 recognizes address input A7 as a test mode during the mode register set operation. The control logic 4 then controls the components of the memory device according to this setting. Accordingly, the data supplied on address input during the mode register set operation are also command data.

In response to the internal clock signal from the clock generator 1, the control logic circuit 4 generates a control signal on the basis of the outputs from the command decoder 3 and the mode register 2. This control signal is supplied to the row address buffer and refresh counter 5, the column address buffer and burst counter 6, the row decoder 9, the sense amplifier 10, the data control circuit 12, and the latch circuit 13.

The row address buffer and refresh counter 5 controls the row decoder 9, and the column address buffer and burst counter 6 controls the column decoder 11. The DLL 7 generates a clock for data input and output to control the input/output buffer 14. The memory array 8 has the row decoder 9, the sense amplifier 10, and the column decoder 11 in the periphery thereof, and exchanges data in a selected memory cell with input/output circuits. The memory array 8 has four banks 0 to 3, and each bank has a plurality of memory subarrays (for which simply memory arrays are interchangeably used herein). The data control circuit 12 and the latch circuit 13 temporarily store data and control the timing at which data is externally input or output. The write or read operation in the overall configuration described above is the same as the prior art operation, and therefore the detailed description thereof is omitted.

The present invention features the provision of an additional control circuit 15 for a test mode in addition to the control logic circuit 4 to be described later. A combination of the additional control circuit 15 and the control logic circuit is hereinafter called a control logic circuit 41.

FIG. 4, schematically illustrates a portion of memory arrays, a portion of peripheral circuits, and the control logic circuit 41. The portion of the memory arrays includes a first memory array 410 at the center, a second memory array 412 on the left, and a third memory array 411 on the right. The first memory array 410 has a plurality of bit line (column line) pairs and a plurality of word lines (row lines) arranged in a row-column fashion. A plurality of memory cells each having a storage capacitor and a MOS transistor are connected to each of bit line pairs, and gates of the transistors are connected to word lines. In FIG. 4, only part of bit line pairs, word lines and memory cells is illustrated for simplification. That is, a first pair of complementary bit lines BL1, /BL1, a second pair of complementary bit lines BL2, /BL2, two word lines and two memory cells are shown.

The first bit line pairs are connected to a pre-charge circuit of transistors T5, T6 and T7 which is adapted to pre-charge bit line pair. The first bit line pair is also connected to a sense amplifier SAL by way of transfer gate transistors T1, T2. The transfer gate transistors are switched by a gate signal TGL appearing on a line TGL while the pre-charge circuit is controlled by a pre-charge control signal BLEQL on a pre-charge control line BLEQL. It should be noted herein that in the description, the same sign is used to indicate a transfer gate, a gate signal for the transfer gate, and a line on which the gate signal appears. Similar expression is used in other parts. The sense amplifier SAL is shared by the second memory array 412 which is connected via transfer gate transistors T01, T02 to the amplifier and is similar in configuration to the center memory array 410.

The second bit line pair is connected to a pre-charge circuit of transistors T8, T9, T10 for pre-charging the second bit line pair. The second bit line pairs is also connected to a sense amplifier SAR by way of transfer gates, or gate transistors, T3, T4. The transfer gates are switched by a gate signal TGR appearing on a line TGR while the pre-charge circuit is controlled by a pre-charge control signal BLEQR on a pre-charge control line BLEQR. The sense amplifier SAR is shared by the third (right) memory array 411 which is connected via transfer gates, or transistors, T03, T04 to the amplifier and is also similar in configuration to the center memory array 410.

The control logic circuit 41 of FIG. 4 includes a conventional control logic 4 and an additional control logic circuit 15 which provides gate signals on the lines TGL, TGR and the pre-charge control lines BLEQL, BLEQR depending on a normal mode and a test mode. The provision of the additional control circuit provides in a test mode a unique switching of connections of bit-line pairs to sense amplifiers by controlling the pre-charge circuit and the transfer gates.

In the test mode, the additional control logic circuit 15 generates control signals for separately controlling the left-side and right-side transfer gate transistors T1, T2 and T3, T4 and pre-charge circuits 432, 431. The left-side transfer gate transistors T1, T2 are controlled by a gate signal TGL generated by first and second transfer control signals TGL1 and TGL2. The right-side transfer gates T3, T4 are controlled by a gate signal TGR generated by first and second transfer control signals TGR1 and TGR2.

The left-side pre-charge circuit 432 is controlled by the pre-charge control signal BLEQL generated by a pre-charge control signal BLEQL1. The right-side pre-charge circuit 431 is controlled by a pre-charge control signal BLEQR generated by a pre-charge control signal BLEQR1. In the description, the suffixes "L" and "R" are used to distinguish the left side and the right of the memory array. No such suffix is added when the memory array is referred to as a whole.

Each memory array has sense amplifiers SAL and SAR, and pre-charge circuits for pre-charging bit lines on the left and right sides thereof, respectively. The memory array further has transfer gates for selecting bit lines of the memory array connected to the sense amplifiers. The bit lines are arranged such that the bit lines are alternately connected to the left and right sense amplifiers SAL and SAR arranged on the left and right sides to face each other. Specifically, the bit lines connected to the left-side sense amplifier and the bit lines connected to the right-side sense amplifier are arranged alternately, for example in the sequence of a left-side bit line BL1, a right-side bit line BL2, a left-side bit line /BL1, and a right-side bit line /BL2. The transfer gate transistors TG select and switch a bit line pair of the memory array connected to the sense amplifiers SA.

Transfer gate transistors T1 and T2 connected to the left-side sense amplifier SAL are controlled by a gate signal TGL. Transistors T5, T6, and T7 forming the left-side pre-charge circuit are controlled by a pre-charge control signal BLEQL. Similarly, transfer gate transistors T3 and T4 connected to the right-side sense amplifier SAR are controlled by a gate signal TGR. Transistors T8, T9, and T10 forming the right-side pre-charge circuit are controlled by a pre-charge control signal BLEQR.

When the gate signals TGL and TGR are active, the central memory array is the selected memory array. In this case, the outside gate signals TGL0 and TGR0 are inactive, and the left-side and right-side memory arrays are non-selected memory arrays. The address signal is input to the control logic 4 via the mode register 2, and the command signal is input to the control logic 4 via the command decoder 3. The control logic 4 logically processes these input signals to generate gate signals TGL and TGR, and pre-charge control signals BLEQL and BLEQR. The additional control circuit 15 controls the normal mode and the test mode by means of the logically processed signals. The transfer control signals TGL1 and TGR1 are test mode entry signals in the test mode, while the transfer control signals TGL2 and TGR2 are gate signals in the normal mode.

FIG. 7 is a timing chart of the normal mode. Shown in FIG. 7 are signal waveforms of (a) a command, (b) a word line, (c) a transfer gate signal, and (d) a bit line. In the normal mode, a memory array is selected by a command ACT, and one word line in the selected array is selected. A description here will be made of the case where the central memory array is selected. The transfer control signals TGL1 and TGR1 are both at a high level, and the transfer control signals TGL2 and TGR2 are both at a low level. The gate signals TGL and TGR thus become a high level. Thus, the transfer gate transistors T1, T2 and T3, T4 are in the ON state. On the other hand, the gate signals TGL0 and TGR0 change to the low level state to disconnect the neighboring memory arrays from the sense amplifiers.

In response to the command ACT, the control logic circuit 4 renders the pre-charge control signals BLEQL and BLEQR inactive and the pre-charge transistors are turned off. The potential of the bit lines is amplified by the sense amplifiers SA to enable writing or reading of data in response to the Write/Read command. Upon subsequently receiving a pre-charge command Pre, the selected word line is rendered inactive. The gate signals TGL0 and TGR0 are rendered active and the pre-charge control signals BLEQL and BLEQR are also changed to the active state to pre-charge the bit lines. These operations are implemented at the same timing as the writing and reading operation of the ordinary semiconductor memory device.

Next, a description will be made of the case where the mode is put into the test mode to detect defects, with reference to the timing chart of FIG. 5 and the connection diagram of FIG. 6.

Illustrated in FIG. 5 are signal waveforms of (a) the command, (b) the word line, (c) the sense amplifier, (d) the gate signal TGL, (e) the gate signal TGR, (f) the pre-charge signal, (g) the object bit lines, and (h) the adjacent bit lines. The waveforms of the bit lines are represented as those of a complementary bit line pair.

In the first step, data is written in the memory cells by the same operation as in the normal mode. By way of example, a high level is written in the cell connected to the object bit line /BL1, a low level is written in the cell connected to the adjacent bit line BL2 neighboring to the object bit line /BL1, while a low level in the cell connected to the other line BL1 of the first bit line pair and a high level in the cell connected to the other bit line /BL2 of the second bit line pair. Thus, mutually inverted data is written in the bit lines BL2 and /BL1 for which the bit-line to bit-line short is to-be detected.

After writing the data, a pre-charge operation is performed according to a command Pre. Then, in response to a command ACT, a word line is selected, and the sense amplifiers amplify the respective cell data, respectively. Subsequently, a command MRS (mode resister set) appears and causes the entry to the test mode. The gate signal TGR is left at a high level in the same manner as in the normal mode. The transfer gate control signal TGL1 is changed to a low level, and the transfer control signal TGL2 is at a low level. The gate control signal TGL is thus changed to a low level. Consequently, the transfer gate transistors T3 and T4 are turned ON, while the transfer gate transistors T1 and T2 are turned OFF.

The bit line pair BL1 and /BL1 is disconnected from the sense amplifier SAL by the transfer gate transistors T1 and T2 being turned OFF, and becomes the floating state (the high impedance state). The transfer gate transistors T3 and T4 are in the ON state, and the bit line pair BL2 and /BL2 remains in the amplified state by the sense amplifier SAR (the low impedance state). The state in which the bit line /BL1 is disconnected from the sense amplifier SAL to become the floating state shall be defined as the high impedance state of the bit line /BL1. In contrast, the state in which the bit line BL2 is connected to the sense amplifier SAR and the sense amplifier is connected to the power supply shall be defined as the low impedance state of the bit line BL2.

The sense amplifier SAR and the bit line pair BL2 and /BL2 undergo a full amplitude at low impedance. If there is a bit-line to bit-line short between the bit lines /BL1 and BL2, the charge stored in the bit line /BL1 in the floating state will be rapidly pulled out by the difference in potential with the adjacent bit line BL2. The object bit line /BL1 is changed from a high level to a low level, and thus, the data indicating the low level is restored into the selected memory cell.

After this, a pre-charge operation is performed in accordance with a command Pre. Then, a command ACT is input, and the read operation is performed in response to a subsequent read command. During this read operation, an expected high level is read as a low level, which makes it possible to detect a bit-line to bit-line short defect. If there is no bit-line to bit-line short, the original correct data will be restored with no charge being pulled out of the bit line pair BL1 and /BL1. Thus, the correct data is read in the subsequent read cycle.

Any bit-line to bit-line short between the object bit line /BL1 and the adjacent and opposing bit line BL2 is detected as described above. Further, a short between the object bit line /BL1 and the non-selected word line (0 V), if any, can be detected simultaneously. The non-selected word line is fixed at a low level and hence in the low impedance state. Therefore, if there is a short, the charge in the bit line/BL1 can be pulled out to a low level, and thus the short can be detected similarly to the bit-line to bit-line short.

If there is a bit-line to bit-line short between the object bit line /BL1 and the bit line /BL2, the short can be detected similarly by writing the initial write data at a high level in the object bit line /BL1 and at a low-level in the bit line /BL2. In this manner, the write level of the bit line for which a short is to be detected is set at a different level from neighboring bit lines. Transfer gates used in a conventional shared type sense amplifier are operated simultaneously and cannot be operated separately as long as the selected memory array is the same. In the present invention, however, the entry to the test mode enables the programmable control of the gate signals TGR and TGL. That is, the left and right transfer gates are separately controlled by means of the gate signals TGR and TGL. The transfer gates on either the left-side or the right-side with respect to the selected memory array are controlled in a different manner from normal operation. One pair of bit line pairs respectively connected to opposing sense amplifiers, namely the object bit line pair is rendered high impedance, while the other bit line pair is rendered low impedance by activating the sense amplifier. If there is leakage due to a bit-line to bit-line short, the current will leak from the high impedance to the low impedance, resulting in change in the bit line level.

Since the sense amplifier of the other opposing bit line pair is connected to the power supply while remaining active and in the low impedance state, it takes a short time to detect the bit-line to bit-line short. Accordingly, it is possible to substantially reduce the period of time that is conventionally defined by a time constant determined by the resistance value and the bit line capacity, and hence the test time can be shortened. The bit lines are connected to the sense amplifiers and caused to undergo a full amplitude at low impedance. This produces a difference in potential between the object bit line and the adjacent bit line, and enhances the short detection sensitivity. When the time constant is denoted by $\tau$, $0.4\tau$ will be sufficient to exceed an intermediate level. One pair of the transfer gates are turned OFF while the other pair of the transfer gates are left ON, whereby the difference in potential between the object bit line and the adjacent bit line can be increased to improve the sensitivity to detect a bit-line to bit-line short.

Moreover, it is not required to perform the bit-line to bit-line short detection operation prior to pre-charge for changing the pre-charge operation. In the prior art, the transfer gates are turned OFF at timing after elapse of a specific time from the falling edge of a write command. In contrast, in the present invention, the transfer gates can be controlled by an external command and hence can be controlled programmably. it is made possible to control the defect detection time according to each type of products by changing the timings of commands MRS, Pre, and ACT to be programmable. Therefore, the defect detection sensitivity also can be adjusted appropriately according to each type of products. This means that the necessity of estimating variation in resistance of the bit-line to bit-line short is eliminated.

According to the first embodiment described above, entry is made to the test mode and the transfer gates used in the shared type sense amplifier are controlled individually. The transfer gate connected to the object bit line is turned OFF and placed in the floating state (high impedance state). The opposing sense amplifier is left active and thereby placed in the low impedance state. If there is a bit-line to bit-line short, the data on the object bit line in the floating state is inverted by the adjacent bit line in the low impedance state. The bit-line to bit-line short can be detected by reading this inverted data.

Next, a description will be made of a second embodiment. In the second embodiment, a bit-line to bit-line short is detected by turning OFF the sense amplifier on the side of an object bit line during and after a pre-charge period to produce the high impedance state, while placing the opposing sense amplifier in the ON state.

Figure 8:
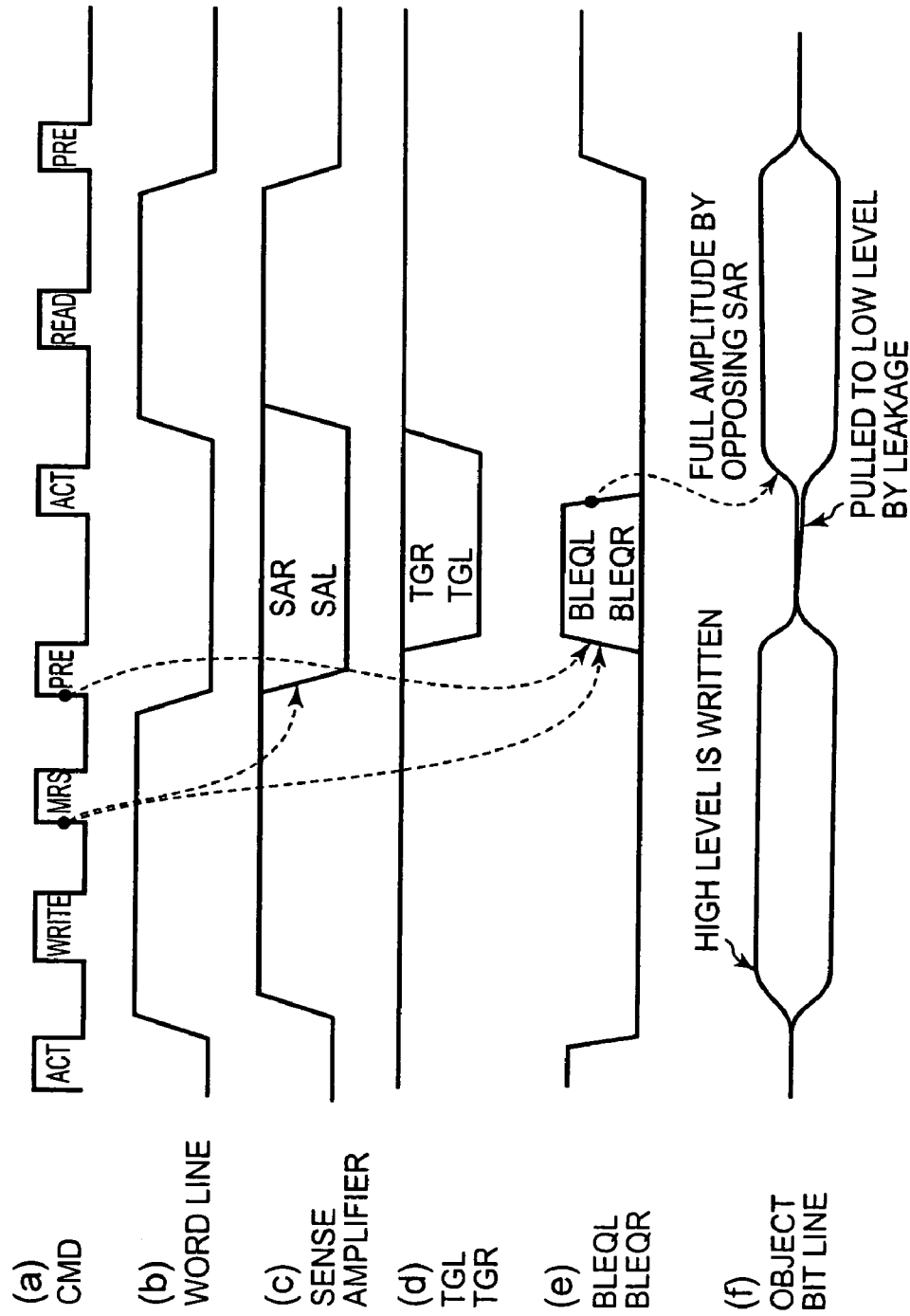
FIG. 8 is a diagram illustrating connections in the periphery of bit lines according to a second embodiment.
Figure 9:
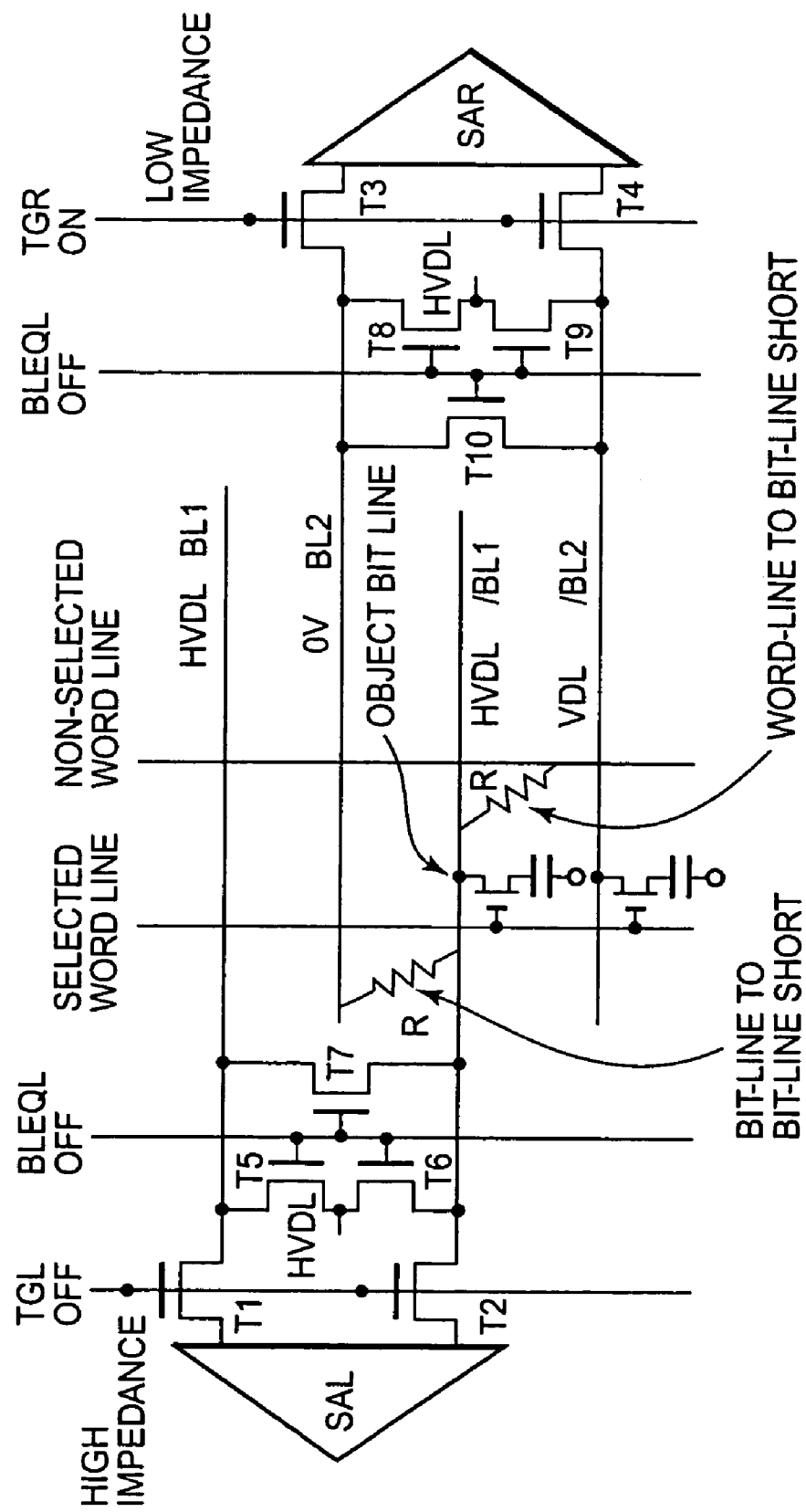
FIG. 9 is an operation in the test mode according to the second embodiment.

FIG. 9 is a connection diagram relating to bit lines of the second embodiment and illustrates a portion ofthe center memory array and its related circuitry shown in FIG. 4, and FIG. 8 shows a timing chart.

In FIG. 8, signal waveforms are shown of (a) a command, (b) a word line, (c) a sense amplifier, (d) a transfer gate signal, (e) a pre-charge signal, and (f) an object bit line.

In the first step, a high level is written in the object bit line /BL1 for which a bit-line to bit-line short is to be detected. The write level is not limited to a high level, and may be set, similarly to the first embodiment, such that the bit lines to be detected are at different levels from each other. Then, entry is made to the test mode in response to a command MRS. This command MRS keeps the sense amplifier SAR active until receiving a subsequent pre-charge command Pre. The pre-charge signal BLEQR is kept inactive until the subsequent pre-charge period. On the other hand, in response to the command MRS, the sense amplifier SAL is turned OFF, putting the bit line pair BL1 and /BL1 into the high impedance state.

The command Pre after the command MRS initiates pre-charge operation. The pre-charge operation here is performed only on the left-side bit line pair BL1 and /BL1 which are in the floating state with the pre-charge signal BLEQL being at a high level and the pre-charge signal BLEQR being at a low level. Accordingly, the bit line pair BL1 and /BL1 is pre-charged to a pre-charge voltage HVDL. The opposing bit line pair BL2 and /BL2 is not pre-charged but is made to undergo a full amplitude by the sense amplifier SAR.

If there is a bit-line to bit-line short between the bit line /BL1 and the bit line BL2, the voltage HVDL on the bit line/BL1 is slightly reduced by the low level (0 V) of the bit line BL2. The voltage thus reduced depends on the difference in the drive capacity between the pre-charge circuit and the sense amplifier SAR. A subsequent command ACT is input, whereby the gate signal TGL is changed to a high level and the pre-charge signal BLEQL is changed to a low level to turn OFF the pre-charge circuit. The turning OFF of the pre-charge circuit places the bit line pair BL1 and /BL1 in the complete high impedance state. The bit line pair BL1 and /BL1 is made to undergo a full amplitude by the sense amplifier SAR in the same manner as the bit line pair BL2 and /BL2.

At the time when a subsequent comnd ACT is input and the sense amplifier SAL is activated, the bit line pair BL1 and /BL1 is made to undergo a full amplitude and held in the inverted state by a bit-line to bit-line short. The bit-line to bit-line short is detected by fail data being read out by the input of the read command. When there is a normal state without a bit-line to bit-line short, the bit line pair BL1 and /BL1 is pre-charged to a pre-charge voltage HVDL. Thus, correct data is read out.

At the same time, short between a non-selected word line and a bit line also can be detected. When there is a short between a word line and a bit line, the bit line /BL1 is pre-charged by leak current to a voltage lower than the pre-charge voltage HVDL. This difference in potential causes the sense amplifier SAL to make erroneous determination, whereby the short between the word line and the bit line can be detected. In the description of the second embodiment, detailed description will be omitted of means for generating control signals for the sense amplifier SAR and control signals for the pre charge signal BLEQR. However, it will be readily appreciated that, like the additional control circuit according to the first embodiment, these signals can be easily generated by combining signals from the command MRS serving as test mode entry signals.

According to the second embodiment, a bit-line to bit-line short is detected if any in response to the command MRS after the pre-charge. The object bit line is pre-charged to the high impedance state, while the sense amplifier of the opposing adjacent bit line is rendered active in the low impedance state. The bit-line to bit-line short can be detected efficiently by activating the opposing sense amplifier to place the same in the low impedance state.

Although the present invention has been described in its preferred embodiments with a certain degree of particularity, it should be understood that the present invention in not limited to the particular description above but may be otherwise variously embodied without departing from the scope of the invention. Further, the description above includes various phases of the invention, and various inventions may be extracted by appropriate combination of a plurality of disclosed constituent features. For example, an invention may be extracted even if some of the features are deleted, as long as a predetermined effect can be obtained.

What is claim is:

1. A semiconductor memory device employing shared type sense amplifiers, the semiconductor memory device comprising a control circuit for placing in a high impedance state a first bit line connected to a first sense amplifier arranged on a first side of a selected memory array, during placing in a low impedance state a second bit line connected to a second sense amplifier arranged on a second side of the selected memory array opposing the first side,
    wherein the first bit line and the second bit line are arranged adjacent to each other and cell data is written into memory cells so that the first and second bit lines assume opposite logic levels, and
    wherein, in a state where cell data is amplified by the first and second sense amplifiers, a first transfer gate arranged between the first sense amplifier and the first bit line is turned OFF while a second transfer gate arranged between the second sense amplifier and the second bit line is turned ON, then cell data is read from the memory cells and a bit line to bit line short is detected by detecting an inversion of a written logic level.

2. The semiconductor memory device according to claim 1, wherein said control circuit receives a test mode set command.

3. The semiconductor memory device according to claim 1, wherein a pre-charge operation and a read operation are performed after detection of the bit-line to bit-line short.

4. The semiconductor memory device according to claim 1, wherein said first bit line comprises a plurality of bit lines,
    wherein said second bit line comprises a plurality of bit lines, and
    wherein said plurality of first bit lines and said plurality of second bit lines are alternately arranged connected to said first sense amplifier to face each other.

5. The semiconductor memory device according to claim 1, wherein during a pre-charge period after data is written into said memory cells from said first and second sense amplifiers, said first bit-line is pre-charged to said high-impedance state, said first sense amplifier is turned off, and said second amplifier is activated in said low impedance state,
    wherein said bit-line short can be detected by activating said second sense amplifier to place said second bit line in said low impedance state.

6. The semiconductor memory device according to claim 1, wherein the first bit tine and the second bit line are arranged adjacent to each other and cell data is written into memory cells so that the first and second bit lines assume opposite logic levels, and
    wherein the semiconductor memory device further comprises:
    a first transfer gaze arranged between the first sense amplifier and the first bit line; and
    a second transfer gate arranged between the second sense amplifier and the second bit line.

7. A semiconductor memory device employing shared type sense amplifiers, the semiconductor memory device comprising a control circuit for placing in a high impedance state a first bit line connected to a first sense amplifier arranged on a first side of a selected memory array, during placing in a low impedance state a second bit line connected to a second sense amplifier arranged on a second side of the selected memory array opposing the first side,
    wherein the first bit line and the second bit line are arranged adjacent to each other and cell data is written into memory cells so that the first and second bit lines assume opposite logic levels, and
    wherein, during a pre-charge period after said cell data is written into the memory cells from the first and second sense amplifiers, the first sense amplifier is placed in an OFF state while the second sense amplifier in an ON state, the first bit line being in a pre-charge state, and the second bit line being made to undergo a full amplitude by the second sense amplifier.

8. The semiconductor memory device according to claim 7, wherein, after termination of the pre-charge period, the first bit line is in the high impedance state while the second bit line is made to undergo a full amplitude by the second sense amplifier, and cell data is read from the memory cells to see if there is an inversion of a written logic level.

9. A semiconductor memory device, comprising:
    a first sense amplifier shared by a first memory array and a second memory array;

a second sense amplifier shared by a first memory array and a third memory array;

a first complementary bit line pair connected to said first sense amplifier via a first switch;

a second complementary bit line pair connected to said second sense amplifier via a second switch, a bit line of said second complementary bit line pair being arranged adjacent to a bit line of said first complementary bit line pair; and a control circuit for controlling said first switch and said second switch for putting said first bit line pair into a high impedance state during putting said second bit line pair into a low impedance state in response to a test mode set command.

10. The semiconductor memory device according to claim 9, wherein said high impedance state and said low impedance state are made by setting said first switch non-conductive and said second switch conductive for a predetermined time.

11. The semiconductor memory device according to claim 10, wherein said predetermined time is programmably controlled by commands and address inputs which are provided externally.

12. The semiconductor memory device according to claim 11, wherein cell data is written into memory cells such that said first and second bit lines assume opposite logic levels.

13. The semiconductor memory device according to claim 12, wherein, in a state where said cell data is amplified by said first and second amplifiers, said first switch is turned OFF while said second switch is turned ON, then cell data is read from said memory cells and a bit line to bit line short is detected by detecting an inversion of a written logic level.

14. The semiconductor memory device according to claim 12, wherein, during a pit-charge period after cell data is written into said memory cells from said first and second sense amplifiers, said first sense amplifier is placed in said OFF state while said second sense amplifier is placed in said ON state, said first bit line being in said pre-charge state, and said second bit line being made to undergo a full amplitude by said second sense amplifier.

15. The semiconductor memory device according to claim 14, wherein, after termination of said pre-charge period, said first hit line is in said high impedance state while said second bit line is made to undergo a full amplitude by said second sense amplifier, and cell data is read from said memory cells to see if there is an inversion of a written logic level.

16. A method of identifying short in lines in memory arrays of a semiconductor memory device, comprising a first sense amplifier shared by a first memory array and a second memory array, a second sense amplifier shared by said first memory array and a third memory array, said first memory array comprising a first complementary bit line pair connected to said first sense amplifier via a first switch, a second complementary bit line pair connected to said second sense amplifier via a second switch, a bit line of said second complementary bit line pair being arranged adjacent to a bit line of said first complementary bit line pair, said method comprising:

writing cell data into memory cells so that said first and second bit lines assume opposite logic levels;

putting said first bit line pair into a high impedance state during puffing said second bit line pair into a low impedance state in response to a test mode set command; and reading cell data from said memory cells to determine if there is an inversion of a written logic level.

17. A method of identifying said short in lines in memory arrays of a semiconductor memory device according to claim 16, wherein said high impedance state and said low impedance state are made by turning off said first switch while keeping said second switch on.

18. A method of identifying said short in lines in memory arrays of a semiconductor memory device according to claim 16, wherein during a pre-charge period, said high impedance state and said low impedance state are made by placing said first sense amplifier off while keeping said second sense amplifier on and putting said first bit line in a pre-charge state and making said second bit line to undergo a full amplitude by said second sense amplifier.

* * * * *